(12) United States Patent
Shimura et al.

(10) Patent No.: US 6,956,740 B2
(45) Date of Patent: Oct. 18, 2005

(54) HEAT SINK WITH FINS AND MANUFACTURING METHOD THEREOF

(75) Inventors: Takahiro Shimura, Tokyo (JP); Hisao Enomoto, Tokyo (JP); Yuzo Nakajima, Tokyo (JP); Masaaki Yamamoto, Tokyo (JP)

(73) Assignee: The Furukawa Electric Co., Ltd. (JP)

( * ) Notice: Subject to any disclaimer, the term of this patent is extended or adjusted under 35 U.S.C. 154(b) by 0 days.

(21) Appl. No.: 10/618,057

(22) Filed: Jul. 11, 2003

(65) Prior Publication Data

US 2004/0037039 A1 Feb. 26, 2004

(30) Foreign Application Priority Data

Jul. 12, 2002 (JP) ........................................ 2002-204536
May 26, 2003 (JP) ........................................ 2003-147657

(51) Int. Cl.⁷ .............................................. H05K 7/20
(52) U.S. Cl. ...................... 361/700; 361/699; 361/704; 257/714; 257/715; 174/15.2; 165/80.4; 165/104.26; 165/185
(58) Field of Search ................................. 361/699, 707, 361/709, 710; 257/706, 715, 722; 174/15.2, 16.1, 16.3; 165/80.3, 104.26; 29/890.032

(56) References Cited

U.S. PATENT DOCUMENTS

| 4,449,578 A | * | 5/1984 | Munekawa ............ 165/104.33 |
| 5,499,450 A | * | 3/1996 | Jacoby .................... 29/890.03 |
| 5,826,645 A | * | 10/1998 | Meyer, IV et al. ..... 165/104.33 |
| 5,960,866 A | * | 10/1999 | Kimura et al. ......... 165/104.33 |
| 5,983,995 A | * | 11/1999 | Shutou et al. ......... 165/104.33 |
| 6,125,035 A | * | 9/2000 | Hood et al. .................. 361/687 |
| 6,424,528 B1 | * | 7/2002 | Chao .......................... 361/700 |
| 6,639,799 B2 | * | 10/2003 | Prasher et al. ............. 361/700 |
| 6,651,732 B2 | * | 11/2003 | Sagal ........................ 185/80.3 |
| 6,717,813 B1 | * | 4/2004 | Garner ....................... 361/700 |
| 2002/0070005 A1 | * | 6/2002 | Kawabata et al. ......... 165/80.3 |
| 2003/0000689 A1 | * | 1/2003 | Kuo et al. .................. 165/185 |
| 2003/0005584 A1 | * | 1/2003 | Komatsu et al. ....... 29/890.032 |

* cited by examiner

*Primary Examiner*—Boris Chervinsky
(74) *Attorney, Agent, or Firm*—Cantor Colburn LLP

(57) ABSTRACT

A heat sink with fins comprising: a base plate made of a heat conductive material; a plurality of heat dissipating fins which are positioned in heat-dissipating-fin mounting portions formed on one surface of said base plate and are jointed to said base plate by mechanical crimping; and at least one heat pipe which is positioned in a heat-pipe mounting portion formed on an opposite surface of said base plate, portions in the vicinity of said heat pipe being crimped to joint said heat pipe to said base plate.

9 Claims, 6 Drawing Sheets

HEAT SINK WITH FINS AND MANUFACTURING METHOD THEREOF

BACKGROUND OF THE INVENTION

1. Field of the Invention

The present invention relates to a heat sink with fins suitable for cooling heat generating components such as semiconductor chips or the like.

2. Related Art

When using electronic components such as semiconductor devices and the like mounted on electric/electronic components including CPUs of personal computers, laser light emitting diodes and power transistors, they inevitably generate heat to some extent. In these days, as an amount of heat generated by an electronic component becomes larger, it becomes a technical problem to cool it. Known as a typical method of cooling electric/electronic components which require cooling are a method of lowering a temperature of air inside the housing of a component, a method of directly cooling a component to be cooled by mounting a cooling body onto the component, and the like.

Used as cooling bodies to be mounted on components to be cooled are a plate member made of a material having excellent heat conductivity such as copper and aluminum, a flat-type heat pipe, a cylindrical heat pipe and the like. A flat-type heat pipe is a plate-type heat pipe. A cylindrical heat pipe is a round-bar-shaped heat pipe.

Next, brief description is made about heat pipes. A heat pipe is a container having a cavity, in which a working fluid is sealed. Since the cavity is vacuumized, the working fluid is easy to be vaporized.

Now, an operation of a heat pipe is briefly described. At a heat absorbing side of the heat pipe, a working fluid is vaporized by heat transferred in a material of a container of the heat pipe. The vaporized working fluid is moved to a heat dissipating side of the heat pipe. At the heat dissipating side, the vaporized working fluid is cooled to become liquid again. Then, the liquefied working fluid flows back to the heat absorbing side (circulation). Such phase transformation and movement of the working fluid allows heat to be moved.

Circulation of the working fluid is carried out by gravity or capillary force. For a gravity type heat pipe, a working fluid is circulated by arranging a heat absorbing portion of the heat pipe below a heat dissipating portion. For a heat pipe which utilizes capillary force in circulation of a working fluid, the working fluid is circulated by capillary force of a groove which is provided in an inner wall of the cavity, or by capillary force of a wick of metal mesh, porous structure or the like which is inserted in the cavity Thus, in a heat pipe, a large amount of heat is transferred by phase transformation and moving of the working fluid in a hermetically sealed cavity of the heat pipe. Surely, some heat is transferred by a container of the heat pipe, however, its amount is relatively small.

In addition, used as a cooling body to be mounted on a component to be cooled is a heat sink having a base plate with heat dissipating fins. Typical heat dissipating fins include extruded fins of one-piece fins and base plate formed by way of an extrusion member, brazed fins formed by jointing heat dissipating fins to a base plate by brazing, crimped fins formed by jointing heat dissipating fins to a base plate by mechanical crimping and the like.

Crimped fins are formed as follows: a base plate is provided with a plurality of grooves, then, into which heat dissipating fins are inserted to be crimped from both sides. A base plate and heat dissipating fins are made of a material having excellent heat conductivity, such as copper and aluminum.

Thus formed crimped fins have the following advantages. A small fin pitch is allowed, which can not be realized in extruded fins which are formed by way of a extrusion member. For brazing, since jointing is carried out at a high temperature, annealing occurs and the material is deteriorated, which results in poor straightness of the fins. For crimped fins, jointing can be performed at a low temperature with excellent fin straightness. Further, for crimped fins, a base plate and heat dissipating fins may be made of different metals. For example, a copper base plate and aluminum heat dissipating fins may be prepared to be jointed to each other.

However, when a heat sink is formed by jointing aluminum heat dissipating fins to an aluminum base plate by crimping, heat dissipating performance is limited, which presents a problem that a component to be cooled of high heat generating density can not be cooled enough. On the other hand, when a heat sink is formed by jointing aluminum heat dissipating fins to a copper base plate by crimping, heat dissipating performance is improved, however, there occurs a problem of heavy weight of the heat sink.

Accordingly, it is an object of the present invention to provide a light-weight heat sink with fins with a small fin pitch and excellent heat dissipating performance.

SUMMARY OF THE INVENTION

The inventors of the present invention have intensively studied in order to solve the above-mentioned problems. As a result, they have found that a heat sink with fins is formed by inserting heat dissipating fins into grooves, which are formed on one surface of a base plate made of a heat conductive material, to joint the heat dissipating fins to the base plate by mechanical crimping, inserting a heat pipe into a recess portion, which is formed on the other surface of the base plate, to joint the heat pipe to the base plate by mechanical crimping, thereby allowing the heat dissipating fins to be arranged with a small fin pitch with significant improvement of the heat dissipating performance of the base plate.

Further, they have found that a heat sink with fins is formed by providing a base plate made of a heat conductive material with a hollow for receiving a heat pipe; inserting heat dissipating fins into grooves, which are formed on one surface of the base plate, to joint the heat dissipating fins to the base plate by mechanical crimping; inserting a heat pipe into the hollow, which is formed in the base plate, to joint the heat pipe to the base plate by mechanical crimping, thereby allowing the heat dissipating fins to be arranged with a small fin pitch with significant improvement of the heat dissipating performance of the base plate.

Furthermore, they have found that, by crossing the longitudinal direction of the heat dissipating fins with the longitudinal direction of the heat pipe, one of the heat dissipating fin group and the heat pipe is allowed to be crimped in the base plate with efficiency with no interference with crimping of the other.

The present invention was carried out in view of the foregoing. A first embodiment of the heat sink with fins according to the present invention is a heat sink with fins comprising: a base plate made of a heat conductive material; a plurality of heat dissipating fins which are positioned in heat-dissipating-fin mounting portions, formed on one surface of said base plate, to be jointed to said base plate by mechanical crimping; and at least one heat pipe which is positioned in a heat-pipe mounting portion formed on an opposite surface of said base plate, portions in the vicinity of said heat pipe being crimped to joint said heat pipe to said base plate.

A second embodiment of the heat sink with fins according to the present invention is a heat sink with fins comprising: a base plate made of a heat conductive material; a plurality of heat dissipating fins which are positioned in heat-dissipating-fin mounting portions, formed on one surface of said base plate, to be jointed to said base plate by mechanical crimping; and at least one heat pipe being inserted into a hollow formed in said base plate, portions in the vicinity of said heat pipe being crimped to joint said heat pipe to said base plate.

A third embodiment of the heat sink with fins according to the present invention is a heat sink with fins comprising: a base plate made of a heat conductive material; a plurality of heat dissipating fins which are positioned in heat-dissipating-fin mounting portions, formed on one surface of said base plate, to be jointed to said base plate by mechanical crimping; and at least one heat pipe which is positioned in a heat-pipe mounting portion formed on the surface of said base plate to which said heat dissipating fins are jointed, portions in the vicinity of said heat pipe being crimped to joint said heat pipe to said base plate.

A fourth embodiment of the heat sink with fins according to the present invention is a heat sink with fins in which a longitudinal direction of said heat pipe is positioned crossed with a longitudinal direction of said heat dissipating fins A fifth embodiment of the heat sink with fins according to the present invention is a heat sink with fins in which the surface of said base plate and a surface of said heat pipe are positioned in the same plane.

A sixth embodiment of the heat sink with fins according to the present invention is a heat sink with fins in which said hollow is formed jutting from the surface of said base plate.

A seventh embodiment of the heat sink with fins according to the present invention is a heat sink with fins in which said heat dissipating fins are cut off at portions corresponding to said heat pipe which is inserted into said heat-pipe mounting portion and jutting from the surface to which said heat dissipating fins are fixed.

Another embodiment of the heat sink with fins according to the present invention is a heat sink with fins in which crimping of said heat pipe is performed by point crimping along the longitudinal direction of said heat pipe.

Yet another embodiment of the heat sink with fins according to the present invention is a heat sink with fins in which crimping of said heat pipe is performed by slit crimping with slits which extends perpendicular to the longitudinal direction of said heat pipe.

Still another embodiment of the heat sink with fins according to the present invention is a heat sink with fins in which an end of said heat pipe extends to a predetermined position so as to provide the end of said heat pipe with another heat sink.

Still yet another embodiment of the heat sink with fins according to the present invention is a heat sink with fins in which said heat pipe is provided crossed with said heat dissipating fins, and said other heat sink comprises a plurality of heat dissipating fins with a fan provided in the vicinity of said heat dissipating fins.

Another embodiment of the heat sink with fins according to the present invention is a heat sink with fins in which said heat-pipe mounting portion comprises a heat pipe receiving portion for receiving said heat pipe and a slit portion for connecting said heat pipe receiving portion and the surface of said base plate.

Yet another embodiment of the heat sink with fins according to the present invention is a heat sink with fins in which said heat-dissipating-fin mounting portions and said slit portion are crossed, and said heat dissipating fins, which are positioned in said heat-dissipating-fin mounting portions to be jointed said base plate by mechanical crimping, press a part of said heat pipe.

Still another embodiment of the heat sink with fins according to the present invention is a heat sink with fins comprising: a base plate made of a heat conductive material; a plurality of heat dissipating fins which are jointed onto one surface of said base plate; and at least one heat pipe which is positioned in a heat-pipe mounting portion formed on the surface of said base plate onto which said heat dissipating fins are jointed, and is jointed onto said base plate.

First embodiment of the heat sink with fins manufacturing method according to the present invention is a heat sink with fins manufacturing method comprising the steps of: preparing a base plate made of a heat conductive material, including on one surface of said base plate, heat-dissipating-fin mounting portions for positioning heat dissipating fins and a heat-pipe mounting portion for positioning a heat pipe; inserting said heat pipe into said heat-pipe mounting portion of said base plate, and inserting said heat dissipating fins into said heat-dissipating-fin mounting portions; and mechanically crimping said heat dissipating fins from both sides of said heat-dissipating-fin mounting portions so that said heat dissipating fins and said heat pipe are jointed to said base plate.

Second embodiment of the heat sink with fins manufacturing method according to the present invention is a heat sink with fins manufacturing method in which said heat-pipe mounting portion comprises a heat pipe receiving portion for receiving said heat pipe and a slit portion for connecting said heat pipe receiving portion and the surface of said base plate, said heat-dissipating-fin mounting portions and said slit portion are crossed, and said heat dissipating fins, which are positioned in said heat-dissipating-fin mounting portions to be jointed to said base plate by mechanical crimping, press a part of said heat pipe.

DETAILED DESCRIPTION OF THE PREFERRED EMBODIMENTS

With reference to the drawings, a fin heat sink according to the present invention will be described in detail below.

An embodiment of a heat sink with fins of the present invention is a heat sink comprising: a base plate made of a heat conductive material; a plurality of heat dissipating fins being positioned in heat-dissipating-fin mounting portions, which are formed on one surface of the base plate, to be jointed to the base plate by mechanical crimping; and at least one heat pipe being positioned in a heat-pipe mounting portion, formed on the opposite surface of the base plate, portions in the vicinity of said heat pipe being crimped to joint said heat pipe to said base plate. Further, the heat sink with fins of the present invention is configured such that the longitudinal direction of the heat pipe is crossed with the longitudinal direction of the heat dissipating fins. Furthermore, the heat sink with fins of the present invention is configured such that a surface of the base plate is in the same plane with a surface of the heat pipe.

Here, the heat dissipating fins may be plate members or pin members. In addition, there is no limit on the shape of the junction portion of the heat dissipating fins and the base plate. For example, for heat dissipating fins of plate members, a heat-dissipating-fin mounting portion may be a groove corresponding to each of the heat dissipating fins formed on the surface of the base plate or may be a protruding portion of a predetermined shape formed on the base plate, corresponding to a groove formed at the end of each of the relatively thick heat dissipating fins. The protruding portion is fitted into the groove before the heat dissipating fin is crimped in the base plate. For pin-shaped heat dissipating fins, a hole may be provided on the base plate, in which case, an end of a pin-shaped fin is inserted into the hole to be jointed by crimping to the base plate.

A heat-pipe mounting portion may be in the form of a recess portion.

Figure 1A:
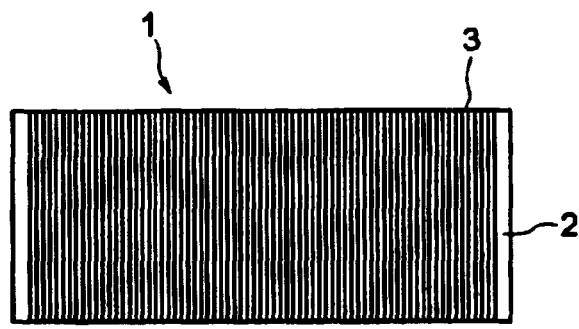
FIG. 1A is a plan view of a heat sink with fins according to the present invention.
Figure 1C:
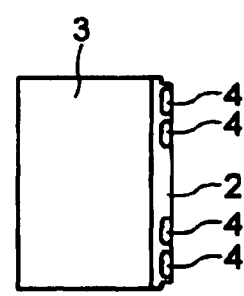
FIG. 1C is a lateral view of a heat sink with fins according to the present invention.
Figure 1B:
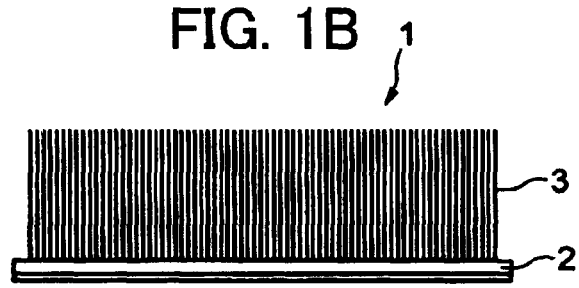
FIG. 1B is a front view of a heat sink with fins according to the present invention.

FIGS. 1A to 1C are explanatory views of a heat sink 1 with fins according to the present invention. FIG. 1A is a plan view of a heat sink with fins, FIG. 1B is a front view of a heat sink with fins, and FIG. 1C is a lateral view of a heat sink with fins.

As shown in FIG. 1A, a plurality of grooves are formed on one surface of a base plate 2 made of a heat conductive member along the width direction of the base plate, and heat dissipating fins 3 are inserted into thus formed grooves in high density with a small fin pitch. While the heat dissipating fins 3 are inserted, the heat dissipating fins 3 are crimped from both sides to be jointed to one surface of the base plate. As shown in FIG. 1B, the heat dissipating fins 3 are jointed to one surface of the base plate in high density with a small fin pitch.

Further, as shown in FIG. 1C, formed in a surface opposite to the surface onto which heat dissipating fins of the base plate 2 are jointed, are recess portions each corresponding in size to a heat pipe. Heat pipes are inserted into thus formed recess portions, and portions in the vicinity of said heat pipe are crimped onto said heat pipe to fix the heat pipes in such a manner that exposed surfaces of the heat pipes are in the same plane as the surface of the base plate. The heat pipes may be a cylindrical heat pipe, a flat-type heat pipe or a plate-type heat pipe. For use of a cylindrical heat pipe, the cylindrical heat pipe is subjected to flattening in such a manner that exposed surfaces of the heat pipes are in the same plane as a surface of the base plate. As shown in FIGS. 1A to 1C, the longitudinal direction of the heat dissipating fins is crossed with the longitudinal direction of the heat pipes.

A recess portion into which a heat pipe is inserted is formed by extrusion, while plural grooves are formed by a plurality of fine cutters. However, the reverse of the above-described method may be applied here.

Figure 2A:
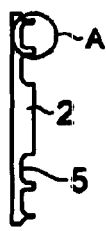
FIG. 2A is a lateral view showing a base plate having recess portions.
Figure 2B:
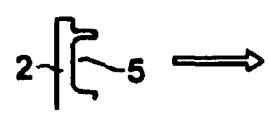
FIG. 2B shows a process of jointing a heat pipe to a base plate by crimping, showing in enlarged dimension the circled portion in FIG. 2A.
Figure 2B:
Figure 2B:

Next description is made of a method for fixing a heat pipe to a base plate. FIGS. 2A and 2B are explanatory views of a method for jointing heat pipes to a base plate by crimping. FIG. 2A is a lateral view of a base plate having recess portions. As shown in FIG. 2A, recess portions 5 are formed in the base plate 2, at positions where heat pipes are positioned, each recess portion corresponding in size to a heat pipe. FIG. 2B shows a process of jointing a heat pipe to a base plate by crimping, showing in enlarged dimension the circled portion in FIG. 2A.

As shown in FIG. 2B, formed in a surface of the base plate 2 is a recess portion 5 corresponding in sectional size to a heat pipe. A heat pipe 4 is inserted into the thus formed recess portion. Then, portions B in the close vicinity of the recess portion into which the heat pipe is inserted are crimped (pressed and deformed) to joint the heat pipe to the base plate. At this time, there is no space provided between the heat pipe and the base plate, and they are closely, thermally connected to each other. The exposed surface of the heat pipe and a surface of the base plate are in the same plane to retain the high flatness.

Figure 3A:
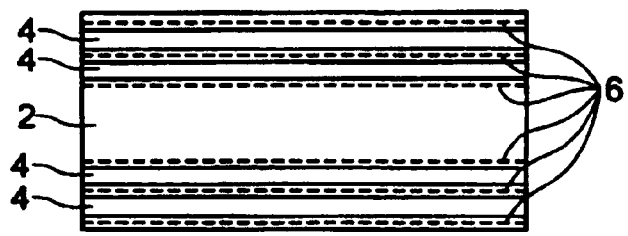
FIG. 3A shows that heat pipes are jointed by point crimping.
Figure 3B:
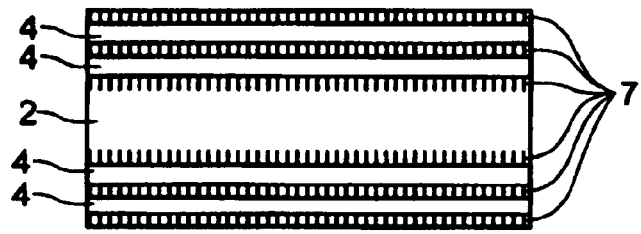
FIG. 3B shows that heat pipes are jointed by slit crimping.

FIGS. 3A and 3B are views showing a surface of a base plate into which heat pipes are inserted and jointed by crimping. FIG. 3A shows heat pipes are jointed by point crimping; FIG. 3B shows heat pipes are jointed by slit crimping. As shown in FIG. 3A, while heat pipes 4 are inserted into recess portions formed in a surface of a base plate 2 opposed to a surface in which heat dissipating fins are inserted to be crimped, portions in the vicinity of the heat pipe are crimped by point crimping 6.

In other words, two recess portions are formed in each side of the base plate along the longitudinal direction of the base plate, and two heat pipes are arranged in the respective recess portions. While the heat pipes are inserted into the recess portions, portions of the base plate on the both sides and in the vicinity of each of the heat pipes are crimped to the heat pipe by point crimping with continuous points along the longitudinal direction of the heat pipes, thereby fixing the heat pipes to the base plate. A heat generating component is thermally connected to the center of the base plate.

Further, as shown in FIG. 3B, while heat pipes 4 are inserted into recess portions formed in a surface of the base plate 2 opposed to the surface onto which heat dissipating fins are inserted to be crimped, portions in the vicinity of the heat pipe may be crimped onto the heat pipe by slit crimping 7.

In other words, two recess portions are formed in each side of the base plate along the longitudinal direction of the base plate 2, and two heat pipes are arranged in the respective recess portions. While the heat pipes are inserted into the recess portions, along the longitudinal direction of the heat pipes, portions of the base plate in the vicinity of both sides of each of the heat pipe are crimped onto the heat pipe with the use of slits of predetermined length in the direction perpendicular to the longitudinal direction of the heat pipes, thereby securing the heat pipes to the base plate.

In a heat sink with fins of the above-described embodiment, a heat generating component is thermally connected to the center of a base plate, between heat pipes provided at both sides of the base plate, thereby allowing effective utilization of excellent flatness characteristics of the base plate.

Figure 4A:
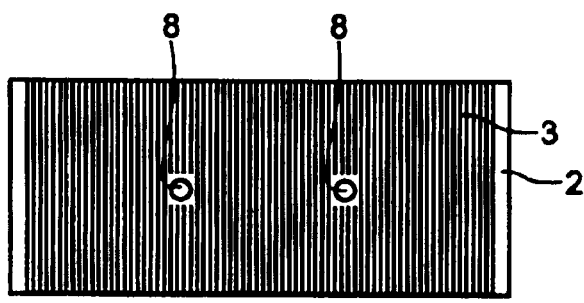
FIG. 4A is a plan view of a heat sink with fins having holes formed in a base plate.
Figure 4B:
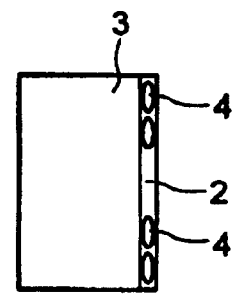
FIG. 4B is a lateral view of a heat sink with fins having holes formed in a base plate.

In order to facilitate junction with the heat generating component, a hole is sometimes prepared in a base plate for mounting the heat generating component thereon. FIGS. 4A and 4B show a heat sink with fins having holes 8 formed in the base plate. FIG. 4A is a plane view of the heat sink with fins and FIG. 4B is a lateral view of the heat sink with fins. As shown in FIG. 4A, holes are bored in the base plate. Such holes are used, for example, in order that a board on which a heat generating component is mounted and the base plate are secured by tightening press nuts into the holes so that the heat generating component is closely, thermally connected to the base plate.

As shown in FIG. 4A, heat dissipating fins are cut off at portions where the holes are bored. On one surface of the base plate 2, a plurality of grooves are formed along the width direction of the base plate. The heat dissipating fins 3 which are cut off partially at hole-bored positions are inserted into thus formed grooves in high density with a small fin pitch. While the heat dissipating fins 3 are in the grooves, then, both sides of each of the grooves are crimped mechanically to joint the heat dissipating fins 3 to the surface of the base plate. As shown in FIG. 4A, the heat dissipating fins 3 are cut off at portions corresponding to the holes, and fixed to the one surface of the base plate in high density with a small fin pitch.

Further, as seen in FIG. 4B, formed on a surface of a base plate 2 opposed to the surface to which heat dissipating fins 3 are fixed are recess portions each corresponding in size to a heat pipe. A heat pipe 4 is inserted into each of the thus formed recess portions. Then, portions around the inserted heat pipes are crimped onto the heat pipes by point crimping, for example, and the heat pipes are secured in such a manner that exposed surfaces of the heat pipes and the surface of the base plate are in the same plane. Here used is a cylindrical heat pipe subjected to flattening. However, the longitudinal direction of the heat dissipating fins is crossed with the longitudinal direction of the heat pipes. Since the heat sink with fins of the present embodiment is configured by securing a board on which a heat generating component is mounted to the base plate by tightening a press nut in a hole, the heat sink with fins can not be deformed even under heavy loads.

Here, another embodiment of a heat sink with fins according to the present invention is a heat sink with fins comprising: a base plate made of a heat conductive member; a plurality of heat dissipating fins being positioned in heat-dissipating-fin mounting portions, which are formed on one surface of said base plate, to be jointed to the base plate by mechanical crimping; and at least one heat pipe which is inserted into a hollow formed in said base plate, portions in the vicinity of said heat pipe being crimped to joint said heat pipe to said base plate.

Figure 5A:
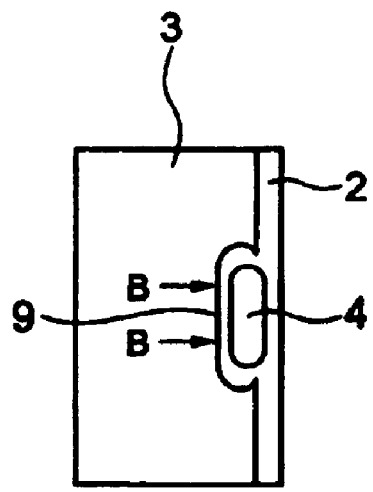
FIG. 5A is a lateral view showing a hollow for receiving a heat pipe is jutting from the heat-dissipating-fin side surface of a base plate.
Figure 5B:
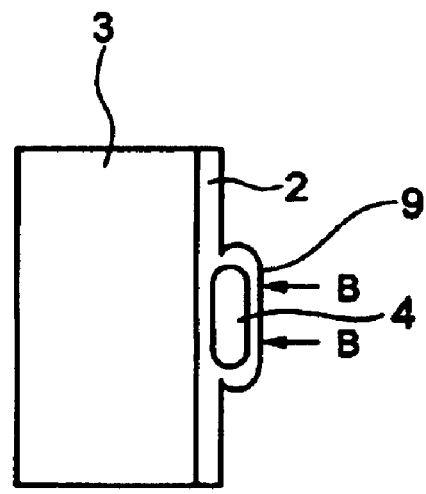
FIG. 5B is a lateral view showing a hollow for receiving a heat pipe is jutting from the surface opposite to the heat-dissipating-fin side surface of a base plate.

According to this embodiment, the base plate is provided with a hollow corresponding in size to a heat pipe. The heat pipe is inserted into thus formed hollow, and portions in the vicinity of the heat pipe are crimped to joint the heat pipe to the base plate. FIGS. 5A and 5B are lateral views for explaining a heat sink with fins of the present invention in which a heat pipe is inserted into a hollow. More specifically, FIG. 5A is a lateral view for showing a hollow for receiving a heat pipe is jutting from the heat-dissipating-fin side surface of the base plate, while FIG. 5B is a lateral view for showing a hollow for receiving a heat pipe is jutting from the surface of the base plate opposite to the heat-dissipating-fin side surface. This embodiment is employed when a heat generating component is thermally connected to a portion into which the heat pipe is inserted, directly.

As shown in FIG. 5B, a base plate is provided in advance with a hole of predetermined shape bored by means of extrusion or the like. Then, a flattened cylindrical heat pipe is inserted into the bored hole. A portion of the base plate into which the heat pipe is inserted is pressed along the arrows B so as to bring the heat pipe into close, thermal connection with the base plate with no gap posed therebetween. Or, the heat pipe is further flattened with pressure applied in the thickness direction to fix the heat pipe to the base plate. According to this embodiment, a portion for receiving a heat pipe is formed jutted out from the surface opposed the surface on which heat dissipating fins are mounted. A heat generating component is thermally connected to a such a jutted portion where the heat pipe is inserted, directly.

A plurality of grooves are formed along the width direction of the base plate on a surface of the base plate 2 opposed to the jutted surface into which the heat pipe is inserted as described above. When heat dissipating fins 3 are inserted into thus formed grooves in high density with a small fin pitch, both sides of the grooves are mechanically crimped to secure the heat dissipating fins 3 into the base plate.

Further, as shown in FIG. 5A, a base plate 2 is provided in advance with a hole of predetermined shape bored by means of extrusion or the like. Then, a flattened cylindrical heat pipe 4 is inserted into the bored hole. A portion of the base plate into which the heat pipe is inserted is pressed along the arrows B so as to bring the heat pipe into close, thermal connection with the base plate with no gap posed therebetween. According to this embodiment, a portion for receiving a heat pipe is formed jutted out to the surface on which to mount heat dissipating fins. A heat generating component is thermally connected to a such a jutted portion where the heat pipe is inserted, directly.

A plurality of grooves are formed along the width direction of the base plate on a jutted-side surface into which the heat pipe 4 is inserted as described above, except for a jutted portion 9 of the base plate 2. When heat dissipating fins 3 are inserted into thus formed grooves in high density with a small fin pitch, both sides of each of the grooves are mechanically crimped to fix the heat dissipating fins 3 to the base plate. The heat dissipating fins take the shape partially curved along the jutted portion 9 into which the heat pipe 4 is inserted. Then, the heat dissipating fins 3 may be fixed to the base plate 2 by inserting heat pipe 4, forming grooves also on the jutted portion 9, inserting the heat dissipating fins 3 into the grooves to joint the heat dissipating fins 3 to the base plate by mechanically crimping both sides of the respective grooves to the heat dissipating fins.

Further, although it is not shown, heat dissipating fins may be positioned on a surface where the heat dissipating fins are not positioned in the heat sink with fins of the embodiment shown in FIGS. 5A and 5B. Or, heat dissipating fins may be jointed by crimping to both surfaces of the base plate.

Further, another embodiment of the heat sink with fins according to the present invention is a heat sink with fins comprising: a base plate made of a heat conductive member; a plurality of heat dissipating fins being inserted into grooves, which are formed on a surface of said base plate, to be jointed to the base plate by mechanical crimping; and at least one heat pipe being inserted into a recess portion formed on the surface of the base plate onto which said heat dissipating fins are crimped, portions in the vicinity of said heat pipe being crimped to joint said heat pipe to said base plate.

According to a heat sink with fins of the present embodiment, as shown in the embodiment of FIG. 1, a recess portion is formed in the base plate, and a cylindrical heat pipe is inserted into thus formed recess portion to be jointed to the base plate by crimping. Then, grooves are formed on the surface of the base plate to which the heat pipe is jointed, and heat dissipating fins are inserted into the grooves to be jointed to the base plate by mechanical crimping.

Figure 6:
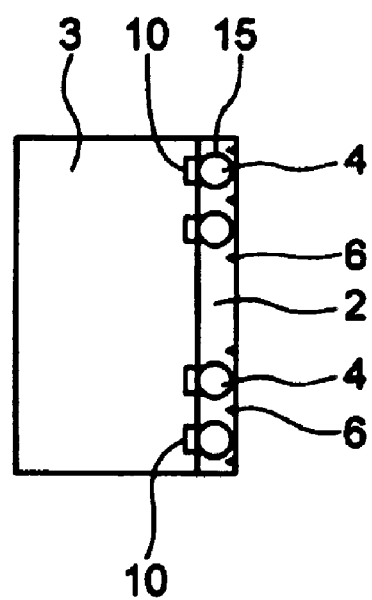
FIG. 6 is a lateral view of a heat sink with fins according to the present invention, in which heat dissipating fins are fixed to a surface at which inserted and jointed heat pipes are exposed.

FIG. 6 is a lateral view of a heat sink with fins according to the present invention, in which heat dissipating fins are jointed to a surface where inserted and fixed heat pipes are exposed.

As shown in FIG. 6, recess portions 15 are formed on a surface of the base plate 2 to which heat dissipating fins 3 are jointed. Each of the recess portions 15 is formed by through-long-hole-boring, for example. When a heat pipe 4 is inserted into the recess portion 15, a portion of the heat pipe 4 is exposed on the surface onto which heat dissipating fins are to be fixed.

The heat pipes 4 are inserted into the thus formed recess portions 15, and the surface of the base plate opposed to the surface to which the heat dissipating fins are subjected to point crimping, for example, to fix the heat pipes in the base plate. As a result of this, portions of the heat pipes 4 are fixed exposed on the surface to which the heat dissipating fins 3 are secured. By the crimping as above, the heat pipes 4 and the base plate 2 are closely, thermally connected with no gap posed therebetween.

On the heat-pipe-exposed-side surface of the base plate 2 into which the heat pipes 4 are inserted to be jointed by crimping, a plurality of grooves are formed along the width direction of the base plate 2, except for portions where the heat pipes are exposed. Then, heat dissipating fins 3 are inserted into the thus formed grooves in high density with a small fin pitch. While the heat dissipating fins 3 are in the grooves, both sides of each of the grooves are mechanically crimped to joint each of the heat dissipating fins 3 to the base plate. The heat dissipating fins are cut off at portions corresponding to the heat pipe exposed portions, at which openings 10 are formed.

Figure 7A:
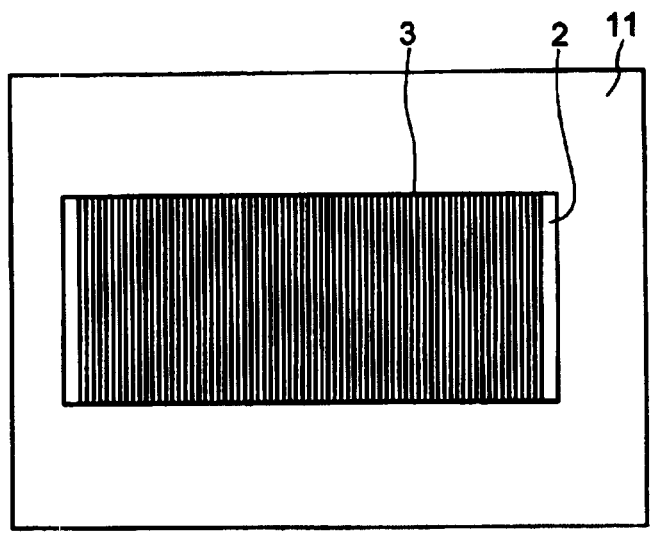
FIG. 7A is a plan view of one embodiment of the heat sink with fins according to the present invention.
Figure 7C:
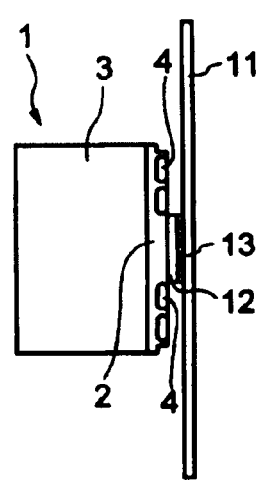
FIG. 7C is a lateral view of the embodiment of the heat sink with fins according to the present invention.
Figure 7B:
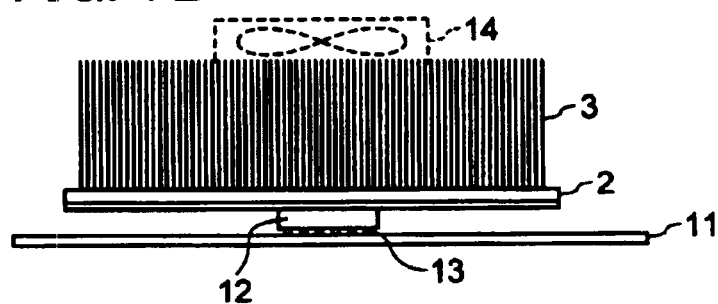
FIG. 7B is a front view of the embodiment of the heat sink with fins according to the present invention.

Next, description is made on implementation of a heat sink with fins of the present invention to a heat generating component. FIGS. 7A to 7C show implementations of a heat sink with fins of the present invention to a heat generating component. More specifically, FIG. 7A is a plan view of the implementation of the heat sink with fins of the present invention, FIG. 7B is a front view of the implementation of the heat sink with fins of the present invention, and FIG. 7C is a lateral view of the implementation of the heat sink with fins of the present invention. As shown in FIGS. 7A to 7C, the heat sink with fins is thermally connected to a heat generating component 12 mounted on a board 11.

In other words, a plurality of grooves are formed on one surface of the base plate 2 of the heat sink with fins along the width direction of the base plate, and heat dissipating fins 3 are inserted into the thus formed grooves in high density with a small fin pitch. While the heat dissipating fins 3 are inserted in the grooves, both sides of each of the grooves are mechanically crimped to joint the heat dissipating fins 3 to the surface of the base plate. On the surface of the base plate 2 opposed to the surface in which the heat dissipating fins 3 are crimped, recess portions are formed each corresponding in size to a heat pipe. The heat pipe is inserted into each of the thus formed recess portion, and portions in the vicinity of the inserted heat pipes are crimped to fix the heat pipe in such a manner that exposed surfaces of the heat pipes can be in the same plane as the surface of the base plate. The longitudinal direction of the heat dissipating fins is crossed with the longitudinal direction of the heat pipes.

Since the heat pipe rapidly moves heat to the whole, including ends of the heat dissipating fins arranged in high density, heat dissipating efficiency is highly improved.

In some situations, a fan may be installed on the heat dissipating fins which is shown by a dotted line on FIG. 7B. The installed fan blows cold air in the direction perpendicular to the heat dissipating fins, thereby forced-dissipating of heat of the heat dissipating fins. The fan may be positioned in such a position that the fan can blow air to the lateral sides of the heat dissipating fins.

In this way, heat of a heat generating component mounted on the board is transferred to the base plate thermally connected thereto. Then, the heat is rapidly moved in the longitudinal direction of the base plate by a plurality of heat pipes inserted into the base plate and fixed thereto, and is dissipated into air by heat dissipating fins fixed onto the base plate. Typical methods for mounting a heat sink with fins onto a printed board include a method of forming a hole for mounting on the base plate and screwing a press nut against the base plate, which is described above with reference to FIG. 4, a method of hanging on a board to secure the assembly to the board with a spring, and the like.

Figure 8A:
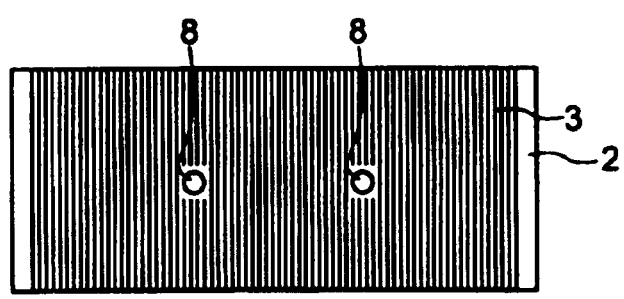
FIG. 8 is a view for showing another embodiment of the heat sink with fins according to the present invention.
Figure 8B:
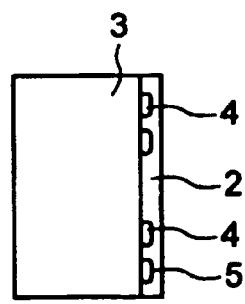

FIGS. 8A and 8B show another embodiment of a heat sink with fins according to the present invention. More specifically, FIG. 8A is a plane view of the heat sink with fins while FIG. 8B is a lateral view of the heat sink with fins.

A heat sink with fins according to this embodiment is a heat sink with fins comprising: a base plate made of a heat conductive member; a plurality of heat dissipating fins being inserted into grooves, which are formed on one surface of said base plate, to be jointed to the base plate by mechanical crimping; and at least one heat pipe being inserted into a recess portion formed on the surface of said base plate in which said heat dissipating fins are crimped, portions in the vicinity of said heat pipe being crimped to joint said heat pipe to said base plate. In other words, the heat sink with fins is configured such that the heat pipe and the heat dissipating fins are fixed to the same surface of the base plate.

As shown in FIGS. 8A and 8B, on a surface of a base plate 2 made of a heat conductive member, recess portions 5 are formed along the longitudinal direction of the base plate, each of the recess portions corresponding in size to a heat pipe. Then, a plurality of grooves for receiving heat dissipating fins are formed along the width direction of the base plate. Inserted into the recess portions are heat pipes. Once the heat pipes are inserted, heat dissipating fins 3 are inserted into the thus formed grooves in high density with a small fin pitch. Then, both sides of each of the grooves are mechanically crimped to joint each of the heat dissipating fins 3 to the one surface of the base plate. In other words, the heat dissipating fins 3 are fixed to the one of the base plate in high density with a small fin pitch, thereby pressing the heat pipes partially to joint them to the same surface of the base plate.

Figure 9A:
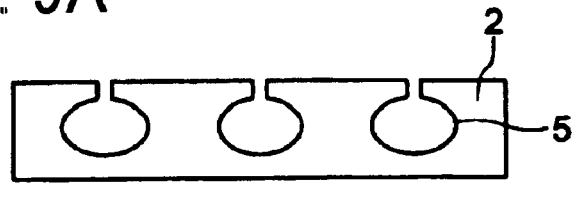
FIG. 9 is a view for showing yet another embodiment of the heat sink with fins according to the present invention.
Figure 9B:
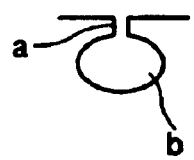
Figure 9C:
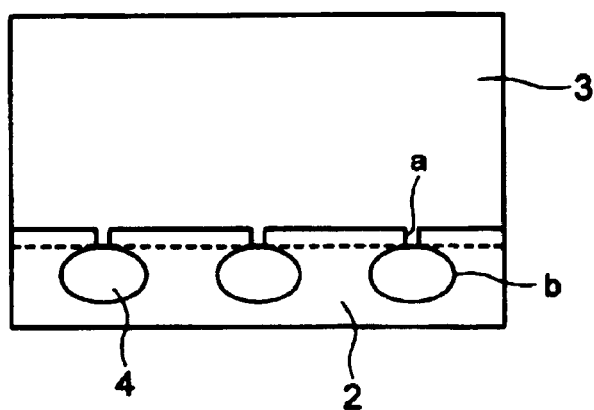

FIGS. 9A to 9C show yet another embodiment of a heat sink with fins according to the present invention. Specifically, FIG. 9A is cross sectional view showing recess potions formed in a base plate, FIG. 9B is an enlarged sectional view of a recess portion, and FIG. 9C is a cross sectional view showing that heat pipes are inserted into corresponding recess potions and a heat dissipating fin is mounted in a groove.

In a heat sink with fins of this embodiment, a recess portion includes a heat pipe receiving portion for receiving a heat pipe and a slit portion for connecting the heat pipe receiving portion and the base plate. Further, the grooves are crossed with slit portions, and the heat dissipating fins, which are inserted into the grooves to be mechanically crimped in the base plate, press the heat pipe partially.

As shown in FIG. 9A, a plurality of recess portions 5 are formed on one surface of the base plate 2 along the longitudinal direction of the base plate 2. As shown in FIG. 9B, each of the recess portions 5 includes a heat pipe receiving portion "b" for receiving a heat pipe 6 and a slit portion "a" for connecting the heat pipe receiving portion to the surface of the base plate. The slit portion has such depth that lower portions of the heat dissipating fins can press a heat pipe partially when the heat dissipating fins are inserted into the grooves.

As shown in FIG. 9C, a heat pipe is inserted into each of the heat pipe receiving portions "b" formed along the longitudinal direction of the base plate 2, and a plurality of heat dissipating fins 3 are inserted into grooves for receiving the heat dissipating fins formed along the width direction of the base plate 2. The heat dissipating fins 3 are inserted into the grooves formed perpendicular to the slit portions "a". The lower portion of each of the heat dissipating fins 3 traverses slit portions and reaches the upper ends of the heat pipes received in the heat pipe receiving portions. Since portions in the vicinity of both sides of each of the heat dissipating fins are mechanically crimped onto the corresponding heat dissipating fin while the heat pipe and the heat dissipating fins are inserted, the heat pipe and the heat dissipating fins are fixed to the base plate.

As described above, in the present embodiment, since heat dissipating fins and a heat pipe are jointed to one surface of the base plate, heat of a component to be cooled which is thermally connected to the other surface of the base plate is moved evenly in the longitudinal direction of the base plate by the heat pipe, and then, the heat is dissipated efficiently by the heat dissipating fins which are thermally connected to the heat pipe and provided in high density with a small fin pitch.

Figure 10:
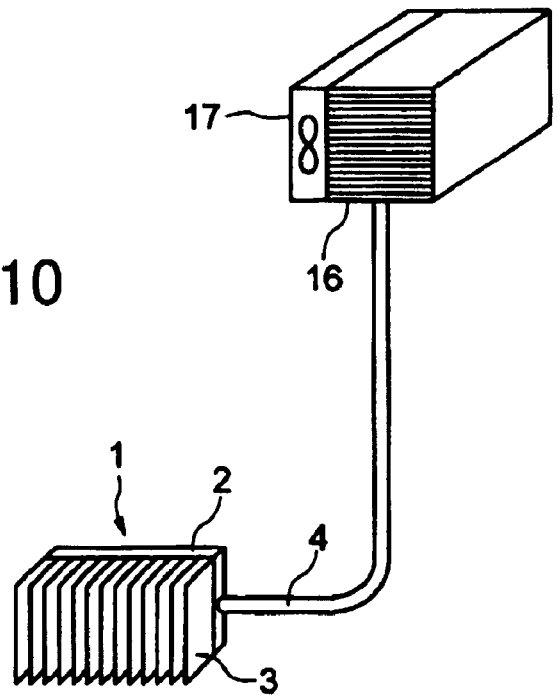
FIG. 10 is a view for showing still yet another embodiment of the heat sink with fins according to the present invention.

FIG. 10 is an explanatory view of another embodiment of a heat sink with fins according to the present invention. A heat sink with fins of this embodiment has at least one heat pipe of which one end extends to a predetermined position to provide the tip end of the heat pipe with another heat sink. The heat pipe is provided crossed with the heat dissipating fins. The latter heat sink comprises a plurality of heat dissipating fins with a fan in the vicinity thereof.

As shown in FIG. 10, one end of a heat pipe 4 is inserted into a hollow formed in a base plate 2. On one surface of the base plate 2, heat dissipating fins 3 are inserted into grooves formed along the width direction of the base plate 2, and the heat dissipating fins are mechanically crimped from the both sides thereby to bring the heat dissipating fins and the heat pipe in fixation to the base plate. In the thus formed heat sink with fins 1, the other end of the heat pipe 4 extends to a predetermined portion to provide the tip end of the heat pipe 4 with another heat sink 16 with plural heat dissipating fins. This heat sink 16 may be provided with a fan 17 for forced air cooling. The heat sink with fins according to the present embodiment may be used in the housing of a personal computer.

Thus, by extending a heat pipe longer than the longitudinal length of the base plate, crimping one end of the heat pipe in the base plate, and providing the other end of the extended heat pipe with another heat sink, heat of a component to be cooled can be dissipated by heat dissipating fins crimped in the base plate, and the heat can be moved to a predetermined position by the heat pipe to be dissipated by another heat sink with heat dissipating fins. Consequently, there is no necessity to enlarging the size of heat dissipating fins to be crimped in the base plate. Therefore, limits to the size of heat dissipating fins are reduced. Further, since the second heat sink can be positioned freely, design flexibility is increased.

Here, heat pipes used in the present invention are not limited to one heat pipe, however, a plurality of heat pipes may be provided. The number of heat pipes may be optionally decided in accordance with heat transferability. Besides, the position of a heat sink mounted onto an extended heat pipe is not limited to the tip end of the heat pipe but may be in the midcourse of the heat pipe.

A personal computer is typically provided with an exhaust fan for releasing air in the housing into the outside. When a base plate in which fins are crimped is used so as to cool a CPU of a personal computer, for example, if the base plate in which the fins are crimped is mounted directly on the CPU and other heat dissipating fins are arranged just before the exhaust fan, the exhaust fan can dissipate in the air heat of the inside of the housing as well as heat of the other heat dissipating fins. This results in avoiding the necessity to provide another fan for the other heat dissipating fins, thereby deadening noise.

As another embodiment, the heat sink with fins according to the present invention may be a heat sink with fins comprising: a base plate made of a heat conductive member; a plurality of heat dissipating fins which are jointed onto one surface of the base plate; and at least one heat pipe which is inserted into a recess portion, formed on the surface of the base plate onto which the heat dissipating fins are jointed, to be jointed onto the base plate. Jointing may be performed, for example, by soldering.

A heat sink with fins according to the present invention is manufactured in the following process. Specifically, the process includes the steps of:

preparing a base plate made of a heat conductive material, including, on one surface of said base plate, heat-dissipating-fin mounting portions for positioning heat dissipating fins and a heat-pipe mounting portion for positioning a heat pipe;

inserting said heat pipe into said heat-pipe mounting portion of said base plate, and inserting said heat dissipating fins into said heat-dissipating-fin mounting portions; and mechanically crimping portions in the vicinity of both sides of each of said heat-dissipating-fin mounting portions so that said heat dissipating fins and said heat pipe are jointed to said base plate.

Further, the heat sink with fins manufacturing method of the present invention is characterized in that said heat-pipe mounting portion comprises a heat pipe receiving portion for receiving said heat pipe and a slit portion for connecting said heat pipe receiving portion and the surface of said base plate, said heat-dissipating-fin mounting portions and said slit portion being crossed with each other, and said heat dissipating fins, which are inserted into said heat-dissipating-fin mounting portions to be jointed to the base plate by mechanical crimping, partially pressing said heat pipe.

Figure 11:
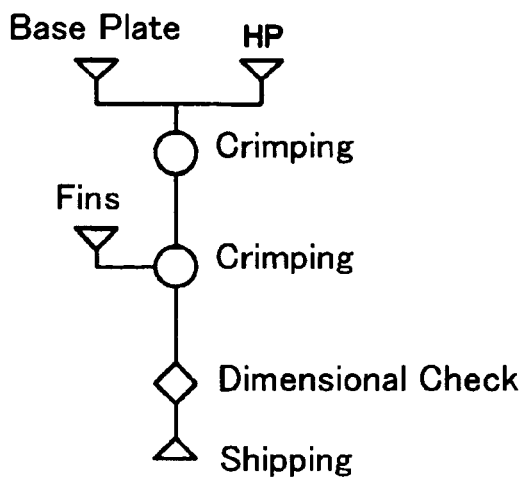
FIG. 11 shows a process of jointing a heat pipe and heat dissipating fins to a base plate by crimping.

Next description is made about a method for fixing a heat pipe and heat dissipating fins to a base plate. As described above, a heat pipe and heat dissipating fins are jointed to a base plate. FIG. 11 shows a process of jointing a heat pipe and heat dissipating fins to a base plate by crimping. As shown in FIG. 11, first, a heat pipe (HP) is jointed to a base plate (e.g., a hollow is formed in the base plate and a heat pipe is inserted into the hollow to be jointed by crimping, or a recess portion is formed in the base plate and a heat pipe is inserted into the recess portion to be jointed by crimping). Then, grooves are formed on the base plate in which the heat pipe is crimped, the heat dissipating fins are inserted into the grooves in high fin-density and crimped from both sides of the respective grooves. Next, dimensional check is performed and shipped. On the other hand, the reverse of the above-described process may be applied in such a manner that, first, heat dissipating fins are crimped in a base plate, and then, a heat pipe is inserted to be jointed to the base plate in which the heat dissipating fins are crimped.

Regarding heat dissipation efficiency, a heat sink with fins according to the present invention as described above (made by jointing aluminum heat dissipating fins and then a heat pipe to an aluminum base plate by crimping) was compared with a conventional heat sink (made by jointing aluminum heat dissipating fins to an aluminum base plate by crimping). A heat sink with fins according to the present invention is a heat sink with fins manufactured as follows: an aluminum base plate with dimension of 65 mm×150 mm×5 mm and seventy-five heat dissipating fins of 0.4 mm thickness are prepared. The heat dissipating fins are arranged on the base plate with a fin pitch of 1.9 mm along the width direction of the base plate, and are crimped on the base plate. On the surface of the base plate opposed to the surface on which the heat dissipating fins are arranged, two heat pipes are inserted into each side of the base plate to be jointed thereto by crimping, as shown in FIG. 1.

The conventional heat sink to be compared is such as manufactured by arranging seventy-five heat dissipating fins of 0.4 mm thickness onto an aluminum base plate with dimension of 65 mm×150 mm×5 mm with a fin pitch of 1.9 mm along the width direction of the base plate, and jointing the heat dissipating fins to the base plate by crimping.

Figure 12:
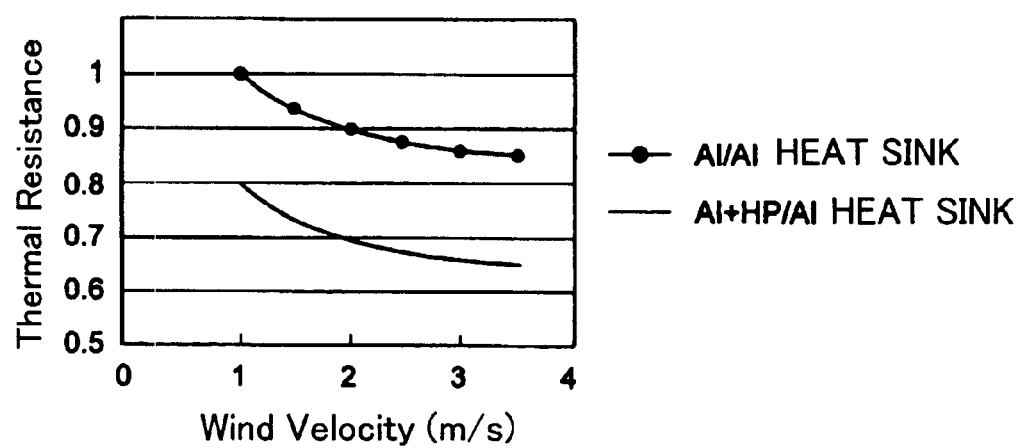
FIG. 12 is a graph showing a comparison of thermal resistance between a heat sink with fins according to the present invention and a conventional heat sink.

Comparison results are shown in FIG. 12, in which the horizontal axis indicates wind velocity (m/s) and the vertical axis indicates thermal resistance (relative value). As is clear from FIG. 12, a heat dissipation performance is improved by 20 percent in the heat sink with fins of the present invention as compared with the conventional heat sink.

As described above, heat dissipating performance of a heat sink with fins according to the present invention is significantly enhanced as compared with a conventional heat sink manufactured by crimping aluminum heat dissipating fins onto an aluminum base plate. Further, as compared with a conventional heat sink manufactured by crimping aluminum heat dissipating fins in a copper base plate, weight reduction and more excellent heat dissipating performance are achieved in a heat sink with fins according to the present invention. Here, the plate-shaped heat dissipating fins used in the above-described heat sink with fins of the present invention are given merely by way of example and without limitation. Heat dissipating fins may be bar-shaped (or, pin-shaped) heat dissipating fins.

Used as a material of a heat pipe container is a metal with excellent heat conductivity, such as copper (C1020, C1100, C1200) and aluminum (A1010, A1100, A5000 series, A6000 series, A7000 series).

Used as wick of capillary structure are wire mesh, sintered metal, metal wool, glass fiber, carbon fiber, ceramic fiber and the like. Typical grooves formed in an inner wall include an axial groove, a circumferential groove, a rectangular groove, a trapezoidal groove, a triangular groove and the like.

As a working fluid, water, alcohol, helium, methane, ammonia, acetone, naphthalene and the like are used in view of compatibility with a container material and a working temperature.

Typical methods for jointing of a heat pipe include brazing (silver brazing, copper brazing, tin brazing), low-temperature soldering and welding (TIG welding, plasma arc welding, laser welding) to allow hermetically sealing.

Aluminum (A1010, A1100, A5000 series, A6000 series, A7000 series) may be applicable to a material of a base plate. Employed as a method of machining a base plate may be pressing, casting, extrusion and cutting. Aluminum (A1010, A1100, A5000 series, A6000 series, A7000 series) may be also applicable to a material of heat dissipating fins.

Heat generating components, which are to be cooled, include electronic devices such as CPUs, diodes, Peltier modules, power modules, and optical devices such as LMD and the like.

Further, a metal with more excellent heat conductivity and the like are used as materials of a base plate and heat dissipating fins, if required.

Therefore, the present invention is allowed to provide a light-weight heat sink with fins capable of excellent heat dissipating performance, comprising heat dissipating fins arranged in high density with a small fin pitch and a heat pipe.

What is claimed is:

1. A heat sink with fins comprising:
a base plate made of a heat conductive material;
a plurality of heat dissipating fins which are positioned in heat-dissipating-fin mounting portions formed on one surface of said base plate and are jointed to said base plate by mechanical crimping; and
at least one heat pipe which is positioned in a heat-pipe mounting portion formed on the surface of said base plate to which said heat dissipating fine are jointed, portions in the vicinity of said heat pipe being crimped to joint said heat pipe to said base plate.

2. The heat sink with fins as claimed in claim 1, wherein said heat-pipe mounting portion comprises a heat pipe receiving portion for receiving said heat pipe and a slit portion for connecting said heat pipe receiving portion and the surface of said base plate.

3. The heat sink with fins as claimed in claim 2, wherein said heat-dissipating-fin mounting portions and said slit portion are crossed, and said heat dissipating fins, which are positioned in said heat-dissipating-fin mounting portions to be jointed to said base plate by mechanical crimping, press a part of said heat pipe.

4. The heat sink with fins as claimed in claim 1, wherein a longitudinal direction of said heat pipe is positioned crossed with a longitudinal direction of said heat dissipating fins.

5. The heat sink with fins as claimed in claim 1, wherein said heat dissipating fins are cut off at portions corresponding to said heat pipe which is inserted into said heat-pipe mounting portion and jutting from the surface to which said heat dissipating fins are jointed.

6. The heat sink with fins as claimed in claim 4, wherein crimping of said heat pipe is performed by point crimping along the longitudinal direction of said heat pipe.

7. The heat sink with fins as claimed in claim 4, wherein crimping of said heat pipe is performed by slit crimping with slits which are perpendicular to the longitudinal direction of said heat pipe.

8. The heat sink with fins as claimed in claim 1, wherein crimping of said heat pipe is performed by point crimping along a longitudinal direction of said heat pipe.

9. The heat sink with fins as claimed in claim 1, wherein crimping of said heat pipe is performed by slit crimping with slits which are perpendicular to the longitudinal direction of said heat pipe.

* * * * *